United States Patent
Khakifirooz et al.

(10) Patent No.: US 12,334,152 B2
(45) Date of Patent: Jun. 17, 2025

(54) SIMULTANEOUS PROGRAMMING OF MULTIPLE SUB-BLOCKS IN NAND MEMORY STRUCTURES

(71) Applicant: Intel NDTM US LLC, Santa Clara, CA (US)

(72) Inventors: Ali Khakifirooz, Brookline, MA (US); Pranav Kalavade, San Jose, CA (US); Shantanu Rajwade, Santa Clara, CA (US); Tarek Ahmed Ameen Beshari, Santa Clara, CA (US)

(73) Assignee: SK Hynix NAND Product Solutions Corp., Rancho Cordova, CA (US)

( * ) Notice: Subject to any disclaimer, the term of this patent is extended or adjusted under 35 U.S.C. 154(b) by 919 days.

(21) Appl. No.: 17/212,792

(22) Filed: Mar. 25, 2021

(65) Prior Publication Data

US 2022/0310160 A1    Sep. 29, 2022

(51) Int. Cl.
*G11C 16/04* (2006.01)
*G06F 3/06* (2006.01)
*G11C 16/10* (2006.01)
*G11C 16/24* (2006.01)
*G11C 16/34* (2006.01)

(52) U.S. Cl.
CPC ........ *G11C 16/0483* (2013.01); *G06F 3/0604* (2013.01); *G06F 3/0659* (2013.01); *G06F 3/0679* (2013.01); *G11C 16/10* (2013.01); *G11C 16/24* (2013.01); *G11C 16/3459* (2013.01)

(58) Field of Classification Search
CPC ..... G11C 16/0483; G11C 16/10; G11C 16/24; G11C 16/3459; G11C 16/32; G06F 3/0604; G06F 3/0659; G06F 3/0679
See application file for complete search history.

(56) References Cited

U.S. PATENT DOCUMENTS

| | | | |
|---|---|---|---|
| 9,553,099 B2 | 1/2017 | Wolstenholme | |
| 2013/0073786 A1* | 3/2013 | Belgal | G06F 12/0246 711/E12.001 |
| 2017/0255410 A1* | 9/2017 | Shiga | G11C 16/3459 |

FOREIGN PATENT DOCUMENTS

WO    2008115570 A1    9/2008

* cited by examiner

*Primary Examiner* — Jay W. Radke
(74) *Attorney, Agent, or Firm* — Morgan, Lewis & Bockius LLP

(57) ABSTRACT

Systems, apparatuses and methods may provide for technology that boosts strings of a plurality of NAND sub-blocks to a pass voltage, deboosts a first subset of the boosted strings based on data associated with the plurality of NAND sub-blocks, and simultaneously programs the first subset while a second subset of the boosted strings remain at the pass voltage. In one example, to boost the strings of the NAND sub-blocks, the technology applies the pass voltage to selected and unselected wordlines that are connected to the NAND sub-blocks while selected and unselected strings are disconnected from a bitline that receives the data associated with the NAND sub-blocks.

18 Claims, 11 Drawing Sheets

SIMULTANEOUS PROGRAMMING OF MULTIPLE SUB-BLOCKS IN NAND MEMORY STRUCTURES

TECHNICAL FIELD

Embodiments generally relate to memory structures. More particularly, embodiments relate to the simultaneous programming of multiple sub-blocks in NAND memory structures.

BACKGROUND

To program cells in a NAND flash memory, a series of program pulses may be applied to a selected wordline (WL) that corresponds to the page address to be programmed. Each program pulse is typically followed by a set of verify operations to compare the threshold voltage of the cells being programmed against verify voltages that correspond to the level at which each cell is to be programmed. Cells that have reached their target threshold voltage may be inhibited in subsequent program pulses by applying an appropriate voltage to bitlines (BLs) corresponding to the cells. The process of programming and verifying is typically iterative and may be relatively time consuming. These programming latencies may lead to performance concerns.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

In recent years, vertical memory, such as three-dimensional (3D) memory has been developed. A 3D flash memory (e.g., 3D NAND memory array) device may include a plurality of strings of charge storage devices (memory cells) stacked over one another (e.g., in a first of three dimensions of 3D) with each charge storage device corresponding to one of multiple tiers of the device. The charge storage devices of a respective string may share a common channel region, such as one formed in a respective pillar of semiconductor material (e.g., polysilicon) about which the string of charge storage devices may be formed.

In a second dimension, each first group of the plurality of strings may comprise, for example, a group of strings sharing a plurality of access lines, known as wordlines (WLs). Each of the plurality of access lines may couple (e.g., electrically or otherwise operably connect) the charge storage devices (memory cells) corresponding to a respective tier of the plurality of tiers of each string. The charge storage devices coupled by the same access line (and thus corresponding to the same tier) may be logically grouped into memory pages, where each charge storage device includes a multi-level cell capable of storing two or more bits of information. In a third dimension, each group of the plurality of strings may include a group of strings coupled by corresponding data lines, known as bitlines (BLs).

Figure 1:
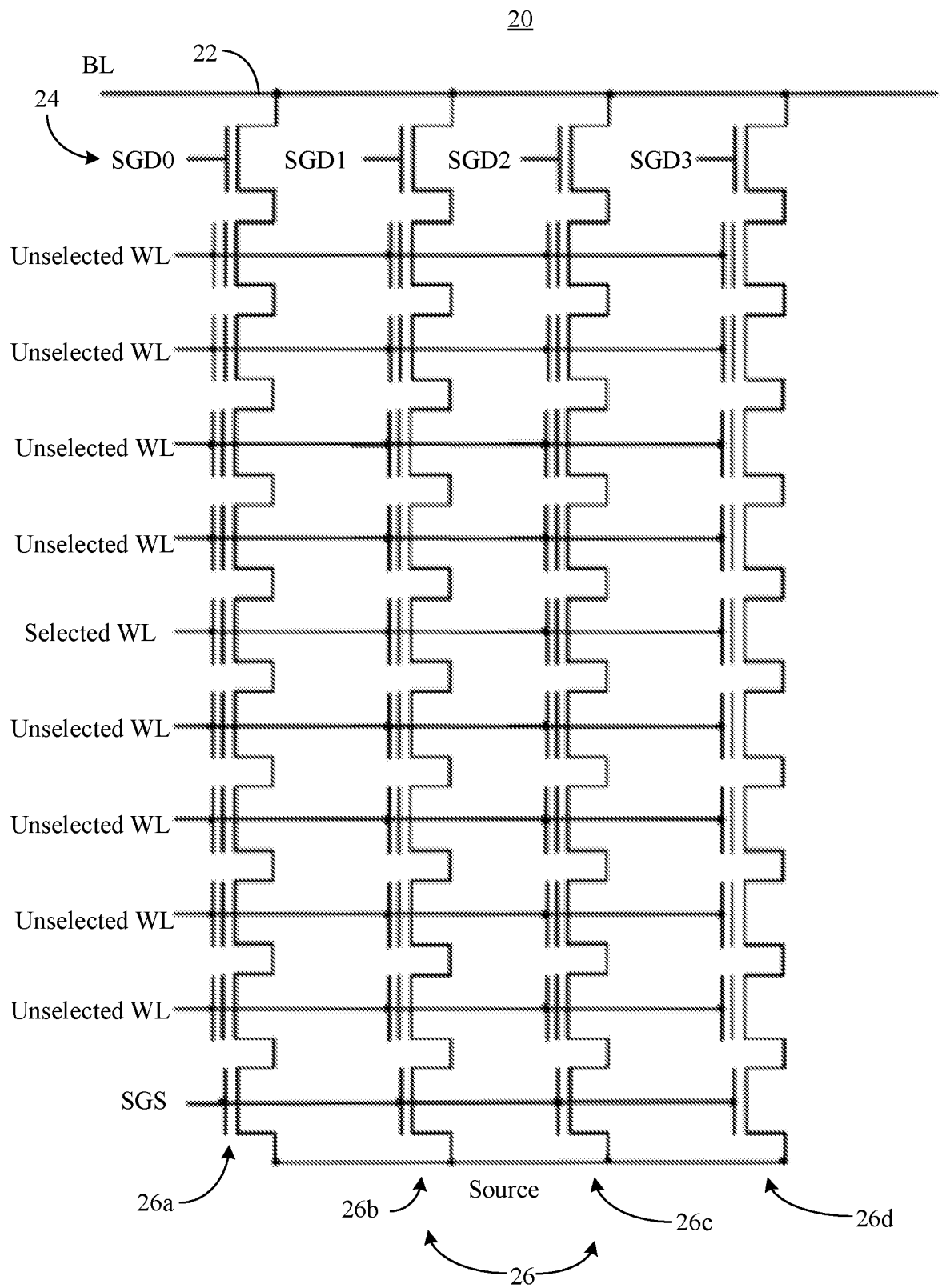
FIG. 1 is a schematic diagram of an example of a section of a NAND block corresponding to one BL according to an embodiment.

Turning now to FIG. 1, a segment of a NAND block 20 (e.g., a portion of three-dimensional/3D NAND flash memory) is shown in which four NAND strings arranged as pillars 26 (26a-26d) are connected to a bitline (BL) 22. The illustrated NAND strings share the same worldlines (WLs) and are connected to the BL 22 through individual drain-side select gate (SGD) transistors 24 ("SGD0" to "SGD3").

In general, programming NAND memory may be performed at a page-level. To program one page of data (e.g., 16 KB plus additional bytes for error correction code/ECC), an appropriate voltage is typically applied to the BL 22 to distinguish between cells that will be programmed during a program pulse and cells that will be inhibited. The set of all strings that share the same local WLs and the same SGD transistors 24 may be considered as a sub-block. As will be discussed in greater detail, embodiments provide for simultaneously programming cells of multiple sub-blocks rather than programming cells of only one sub-block at a time. Such an approach may shorten the process of programming and verifying, which is typically iterative, and in turn enhance performance.

Figure 2:
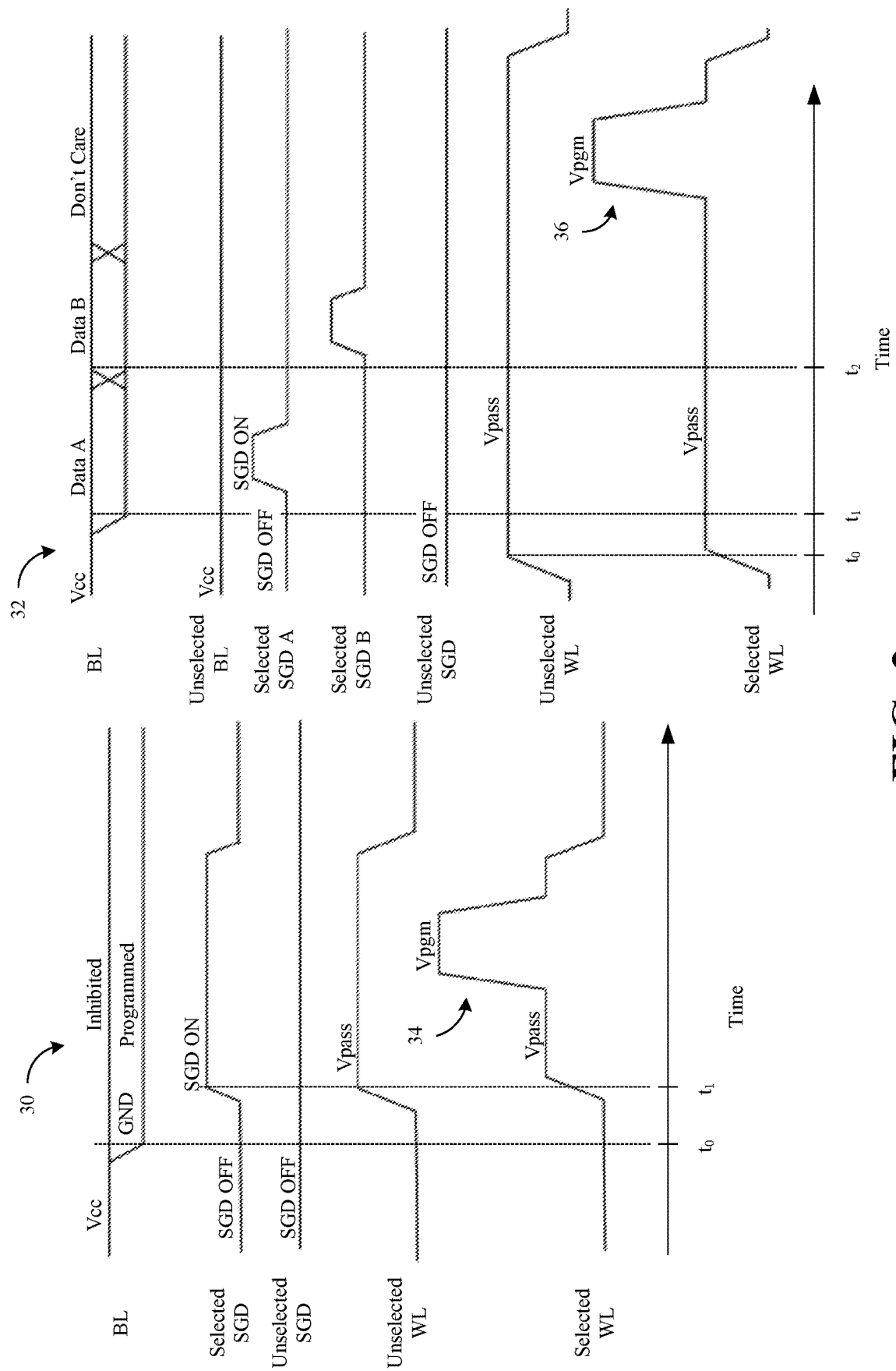
FIG. 2 is a comparative waveform diagram of an example of a conventional programming solution for a single sub-block and a simultaneous programming solution for multiple sub-blocks according to an embodiment.

FIG. 2 shows a conventional programming solution 30 for a single NAND sub-block compared to a simultaneous programming solution 32 for multiple NAND sub-blocks according to an embodiment. In the illustrated conventional programming solution 30, With all strings disconnected from the nodes of a BL (e.g., all SGD transistors being off), an appropriate voltage is applied at time t0 to the nodes of the BL to distinguish between cells that are being programed and cells that are being inhibited during a program pulse 34 ($V_{pgm}$). More particularly, a small voltage such as ground (GND) is applied to BLs being programmed, whereas a relatively large voltage (e.g., supply voltage $V_{cc}$), is applied to the BLs being inhibited.

At time t1, all WLs including selected and unselected WLs are brought to an intermediate voltage (e.g., $V_{pass}$), and the SGD transistors of the selected sub-block are turned on, while unselected SGDs are kept off. The voltage applied to the gate of the selected SGD may be chosen in a way that the transistor turns on if the BL is connected to ground and the transistor remains off if the BL is held at $V_{cc}$. At this moment, all strings that belong to unselected SBs, as well as the strings from the selected SB whose BL voltage is at $V_{cc}$ (e.g., SGD remains off) are floating, which causes the channel potential of the strings to follow $V_{pass}$. This state may be referred as the channel being "boosted". Moreover, $V_{pass}$ may be chosen to be large enough so that an inversion layer is formed for the strings that are connected to the BL (e.g., strings that belong to the selected SB and whose BL is at GND). The channel potential for the strings with the inversion layer is at GND. In practice, a slightly different $V_{pass}$ may be used for different WLs to control the potential profile along the channel and minimize program and inhibit disturbances.

Next, a relatively large voltage (e.g., $V_{pgm}$), is applied to the selected WL. For cells of strings that are being programmed (e.g., selected SBs with BL at GND), the difference between $V_{pgm}$ and channel potential is large enough to cause significant Fowler-Nordheim (FN) tunneling (e.g., field electron tunneling) to program the cells. For other cells, the difference between gate voltage and channel potential is roughly ($V_{pgm}$-$V_{pass}$), causing the cells to not be programmed. All voltages may then be brought down and a set of verify operations may be performed to compare the threshold voltage of cells against predetermined verify voltages.

By contrast, the simultaneous programming solution 32 programs cells of two SBs with a single program pulse 36. In this example, Data A is used to program cells in a first SB (e.g., SB A) and Data B is used to program cells in a second SB (e.g., SB B). In an embodiment, all WLs are initially brought to $V_{pass}$ at onetime to boost all strings in both SB A and SB B as well as other unselected SBs. At time t1, an appropriate voltage (e.g., GND vs $V_{cc}$) is placed on the BLs according to Data A and SGD A is momentarily turned on. At this moment, strings from SB A whose cells are targeted to be programmed (e.g., BL at GND), will be connected to the BL, causing the channel potential of the cells to become nearly zero. These strings may be referred to as "deboosted". In one example, all other strings remain boosted. After SGD A is turned off, the BL voltage may be changed according to Data B at time t2 and SGD B is momentarily turned on. At this moment, strings from SB B whose BL is at ground will be deboosted. Then, SGD B may be turned off and $V_{pgm}$ may be applied to the selected WL. Accordingly, all strings that remained boosted will be inhibited from programming. Strings that were deboosted, however, remain substantially near ground even though the strings are isolated from the BL. With $V_{pass}$ being large enough, the extra number of electrons to keep the channel potential under the selected WL is being supplied by the inversion layer formed under the unselected WLs. Therefore, when $V_{pgm}$ is applied, all cells of the selected WL to be programmed from both SB A and SB B are programmed simultaneously.

The illustrated simultaneous programming solution 32 therefore enhances performance at least to the extent that cells of multiple SBs are programmed with the single program pulse 36. Moreover, the above operation of 1) boosting all SBs 2) placing the data on BL and turning the SGDs on one at a time to deboost the strings, and 3) applying the program pulse 36 with all SGDs off, may be extended to more than two SBs to achieve higher parallelism and increased program speed.

Figure 3:
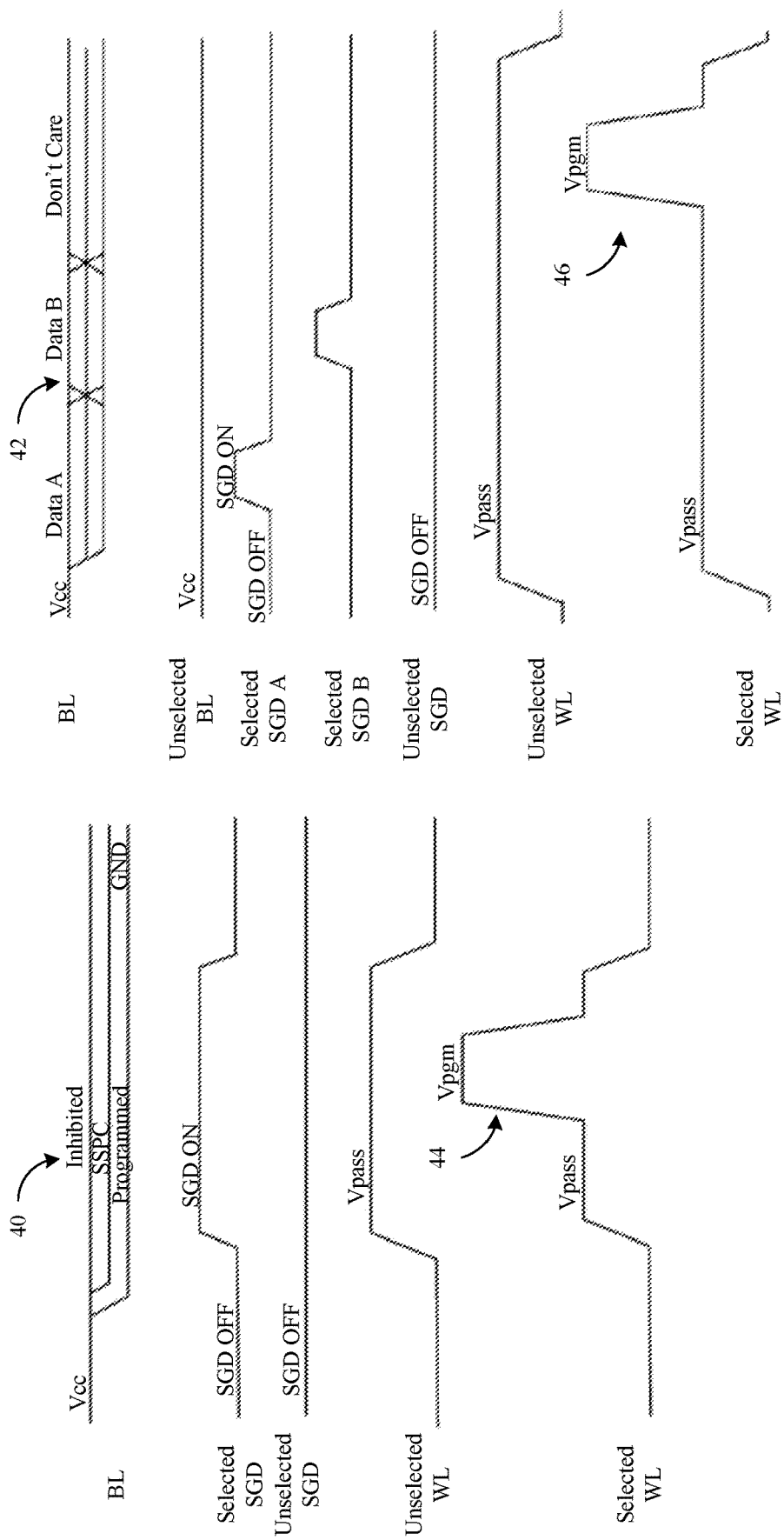
FIG. 3 is a comparative waveform diagram of an example of a conventional selective slow program convergence (SSPC) solution for a single sub-block and a simultaneous SSPC solution for multiple-sub-blocks according to an embodiment.

FIG. 3 shows a conventional selective slow program convergence (SSPC) solution 40 for a single NAND sub-block and a simultaneous SSPC solution 42 for multiple NAND sub-blocks. In the conventional SSPC solution 40, cells are grouped to three categories during a program pulse 44: 1) cells that remain inhibited (e.g., cells that have already passed a target threshold voltage and receive a relatively high voltage, such as $V_{cc}$); 2) cells that are programmed (e.g., cells that receive a low voltage such as ground); and 3) cells that are close to the target threshold voltage but have not yet passed a verify sequence (e.g., cells that receive an intermediate voltage $V_{BL\_SSPC}$, such as 1V). The SGD voltage for the selected SB may be chosen in a way that the SGD transistors are on with $V_{BL\_SSPC}$ but remain off with $V_{cc}$ on the BL. As a result, SSPC cells receive a program voltage of $V_{pgm}$-$V_{BL\_SSPC}$ and are made to be slower to program compared to cells that receive $V_{pgm}$.

By contrast, the simultaneous SSPC solution 42 programs cells in two SBs simultaneously with an SSPC scheme. First, all strings are boosted. Then the data to distinguish cells in program, inhibit, and SSPC "buckets" (e.g., designations) for the first SB are placed on the BLs and the first SGD transistor is turned on momentarily. After SGD A is turned off, data for the second SB is placed on the BLs and the second SGD is momentarily turned on. After the SGDs are turned off, a program pulse 46 (e.g., $V_{pgm}$) is applied to the selected WL.

Figure 4:
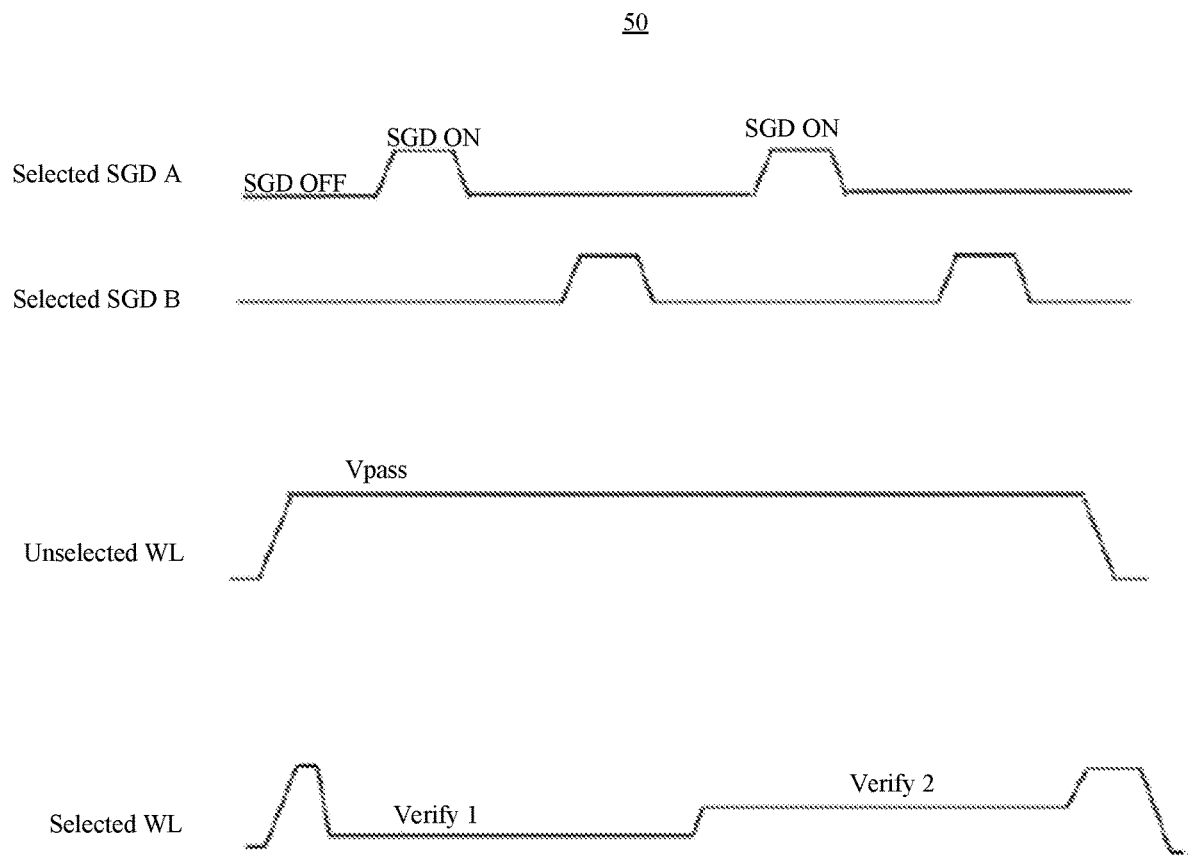
FIG. 4 is a waveform diagram of an example of a program verification sequence according to an embodiment.

Turning now to FIG. 4, after applying each program pulse, a verify operation sequence 50 may be performed to determine if the threshold voltage of cells have passed the target verify voltage. If so, the cells may be given the inhibit designation for subsequent program pulses. Additionally, cells whose threshold voltage is close to the verify voltage but verify has not yet been passed, may be given the SSPC designation for subsequent program pulses. The verify operation may be performed by bringing all WL voltages to a relatively large voltage so that an inversion channel is formed in the NAND strings, pre-charging the BLs and turning on SGD and source-side select gate (SGS) transistors for the selected SB, and bringing the selected WL voltage to the verify voltage. Cells with a threshold voltage below the verify voltage will conduct, which causes the BL current to be detected by a sensing circuit connected to the BL. By contrast, cells with a threshold voltage (e.g., $V_t$) higher than the verify voltage will not conduct. In an embodiment, the selected WL voltage ramps (up or down) to a series of verify voltages according to the number of levels to which the cells are being programmed, waiting until the WL voltage is stable and sensing the BL current.

In one example, cells in multiple SBs are sensed without changing the WL voltages and by turning SGDs one at a time to sense the corresponding cell current. The illustrated verify operation sequence 50 therefore further enhances performance by enabling a single set of verify pulses to be applied to the selected wordlines of multiple NAND sub-blocks.

Figures 5, 6:
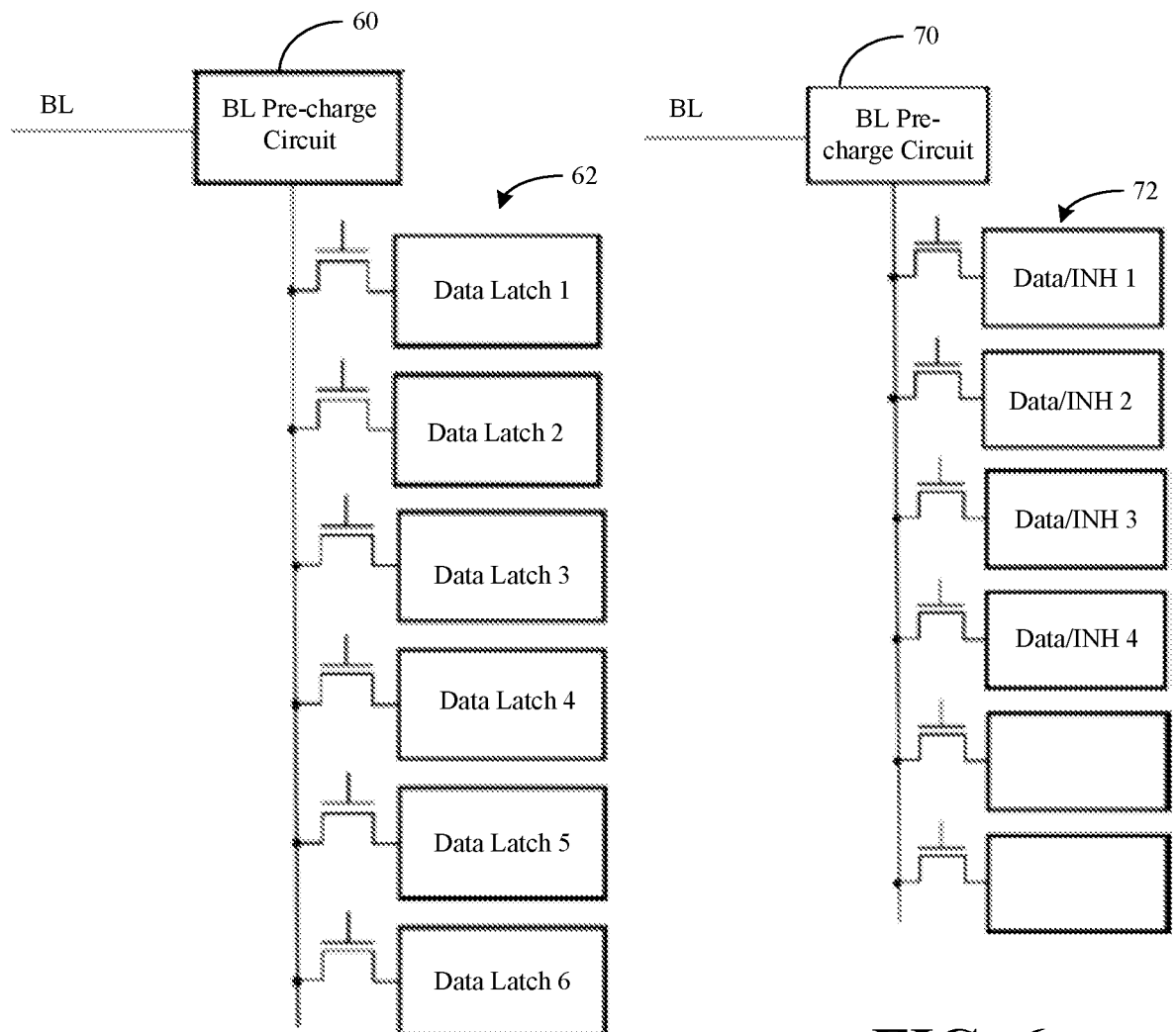
FIGS. 5-7 are block diagrams of examples of latch configurations according to embodiments.

Turning now to FIG. 5, the BL may be equipped with a pre-charge circuit 60 (e.g., peripheral) that is capable of sensing the threshold voltage of cells and applying the appropriate voltage to the BL for program and read operations, and a set of data latches 62 ("Data Latch 1" to "Data Latch 6", e.g., volatile memory) to maintain the data to be programmed to the cell. For example, in a 4-bit-per-cell (quad-level cell/QLC), each BL may be equipped with six data latches 62. Four of the data latches 62 may be used to store the data being programmed, one may be used to indicate if the BL is inhibited for the rest of the program pulses, and one latch may be used if the BL will receive SSPC voltage in the next program pulse (e.g., data associated with the plurality of NAND sub-blocks).

FIG. 6 demonstrates that when used to program cells with a smaller number of bits such as, for example, in a single-level-per-cell (SLC) operation, a set of latches 72 may be assigned by a pre-charge circuit 70 to maintain the data for multiple SBs (e.g., sub-block state data). As an example, four of the latches 72 may be used to hold the data being programmed simultaneously in four SBs. During the first program pulse, for each SB, the corresponding data is applied to the BLs from one of the latches 72 each time and the corresponding SGD is toggled on and off. The BLs with corresponding data being logical 0 will receive GND and BLs with corresponding data being logical 1 receive $V_{cc}$. After applying the first program pulse, the threshold voltage of cells is verified by applying the verify voltage to the selected WL and sensing the current for each SB by turning on the SGDs one at a time. Cells whose $V_t$ pass the verify condition are marked as inhibited by modifying the corresponding data latch 72 into logical 1.

Figure 7:
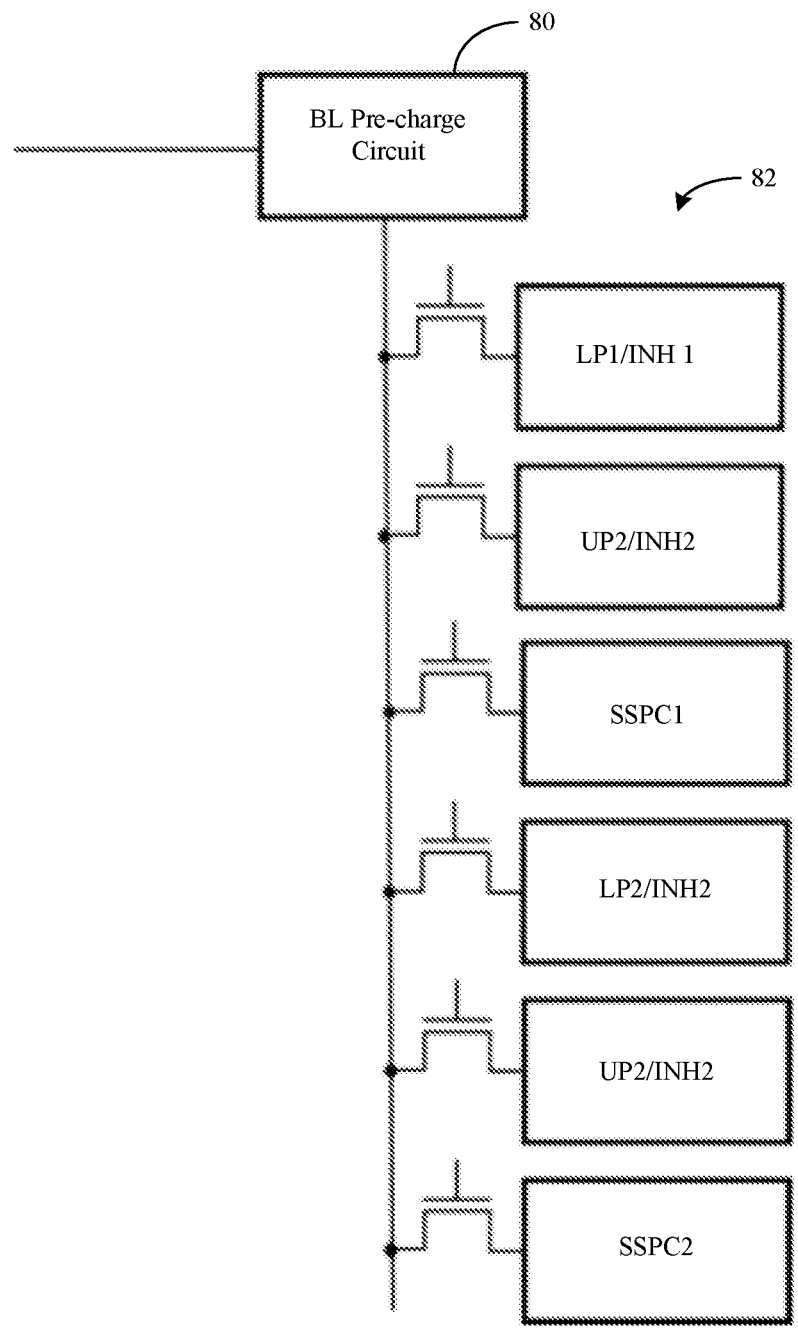
Figure 8:
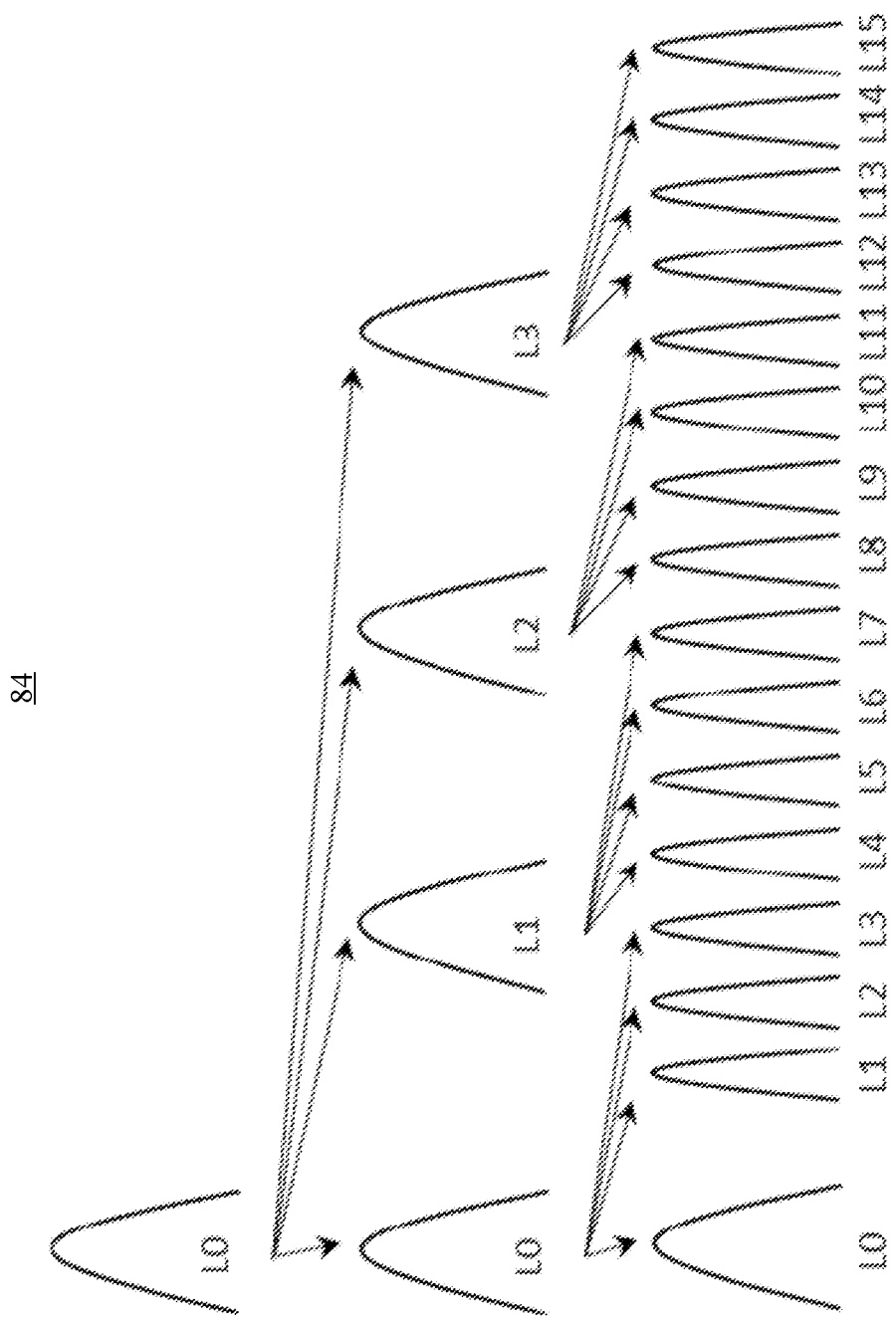
FIG. 8 is an illustration of an example of a page programming solution for a quad-level cell (QLC) architecture according to an embodiment.

As another example, FIGS. 7 and 8 show a possible assignment of data latches 82 to maintain data for two SBs being programmed in a two-level-per-cell operation (e.g., multi-level cell/MLC). This approach may be used in an MLC operation or, for example, as a first pass of a QLC page programming solution 84 according to a so-called 4-16 programming sequence. In this example, the NAND programs each cell into four possible threshold voltage distributions based on two pages of data, labeled as lower page (LP) and upper page (UP). The operation is performed simultaneously on two SBs, which causes a pre-charge circuit 80 to assign the data latches 82 to maintain data for two SBs. Cells that are inhibited may be marked by setting the corresponding LP and UP both to logical 1 as if the cells belong to threshold voltage bucket L0 and remain inhibited.

Typically, programming algorithms may include the operations of counting the number of cells that pass or fail the verify level. For example, at the beginning of a program operation, the number of cells that pass verify after a program pulse may be counted to determine if a prescribed number of cells has passed verify and calculate an optimum program start voltage for subsequent program operations. In some embodiments, in a simultaneous multi-SB programming, a program operation may be executed in a single SB mode until the prescribed number of cells pass verify and after that a switch may be made to multi-SB mode to reduce unnecessary operations. In some embodiments, a program pulse may be executed in multi-SB mode but a verify of subsequent SBs may be skipped if the first SB has not reached the prescribed number of passing cells.

Similarly, the number of cells that fail verify may be counted to determine if substantially enough cells have been programmed to stop performing verify operations or finish the program algorithm altogether after a given program pulse. In an embodiment, the number of failing cells is counted only for one of the SBs or for all of the SBs by performing a logic AND operation of the inhibit cells.

Figure 9:
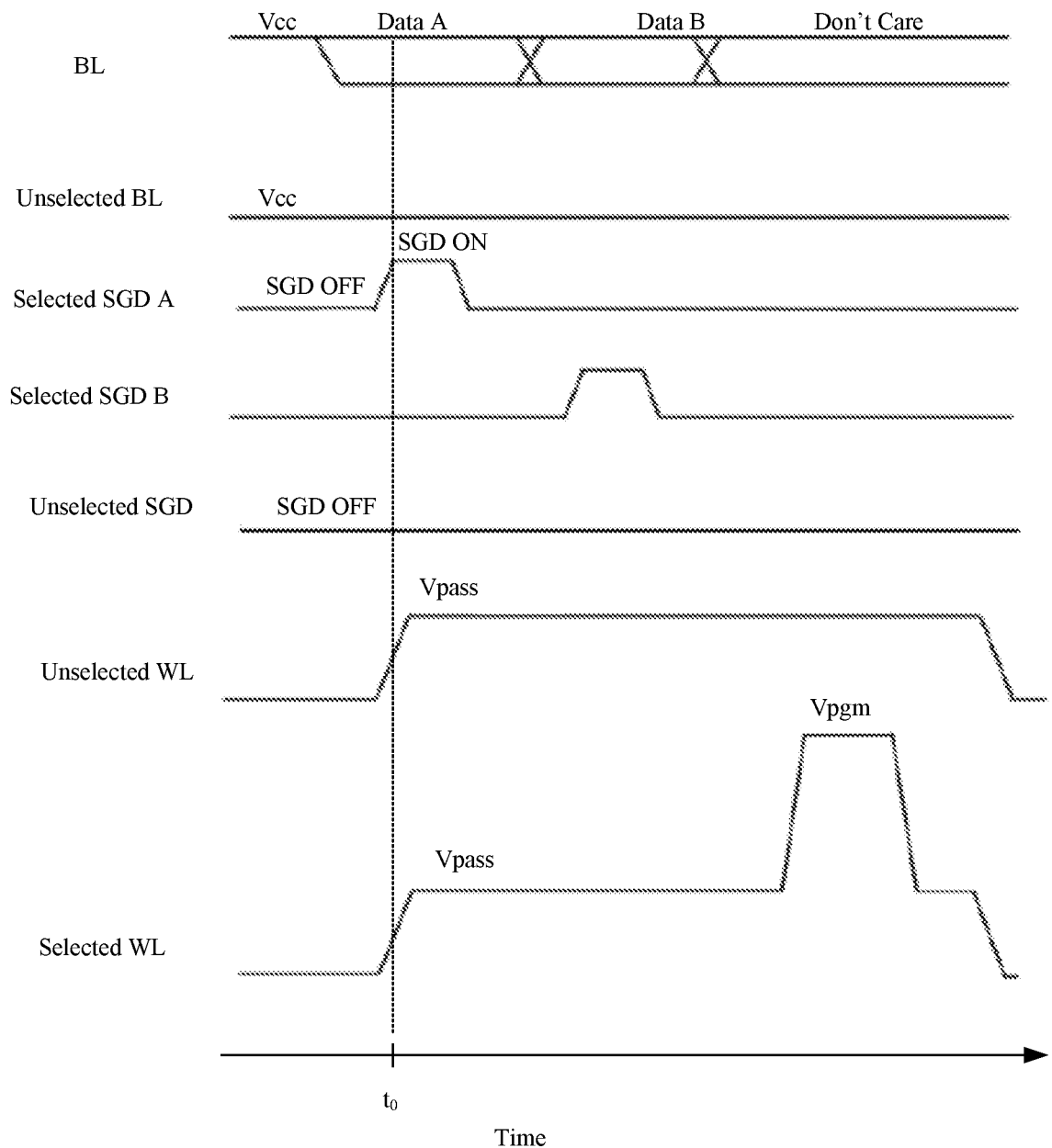
FIG. 9 is a waveform diagram of an example of a bypass of a boost of an initial NAND sub-block according to an embodiment.

FIG. 9 shows a programming solution 90 in which the initial SB in a set of SBs that are being programmed simultaneously is not boosted. In the illustrated example, the SGD for SB A is turned on at time to with the corresponding data already on the BLs, while bringing the WLs to $V_{pass}$.

Figure 10:
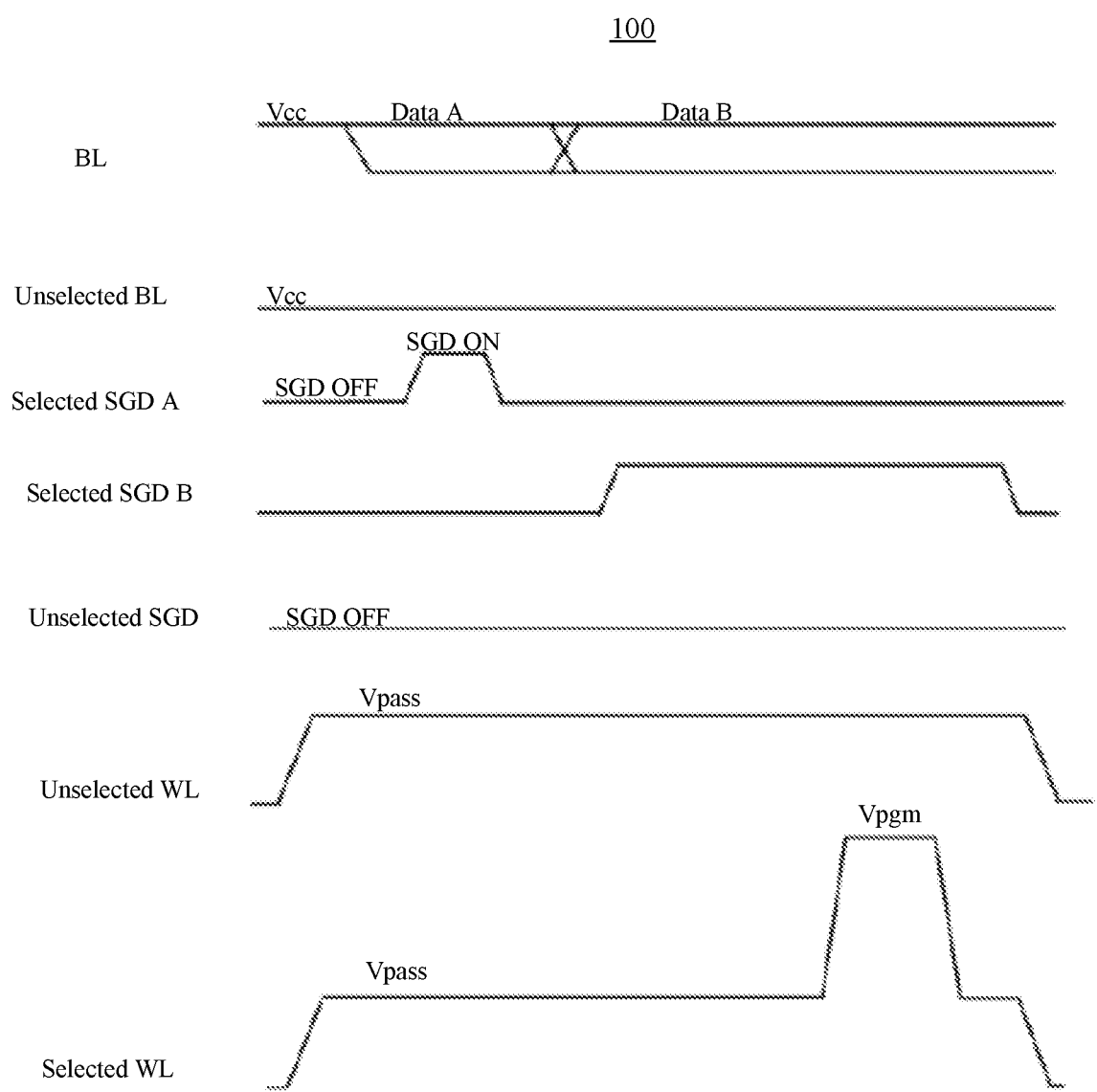
FIG. 10 is a waveform diagram of an example of a connection of a final sub-block to a bitline until a subset of strings is programmed according to an embodiment.

FIG. 10 shows a programming solution 100 in which the last SB in a set of SBs that are programmed simultaneously is kept connected to the BL throughout the program pulse. The illustrated example therefore represents a hybrid approach.

Figure 11:
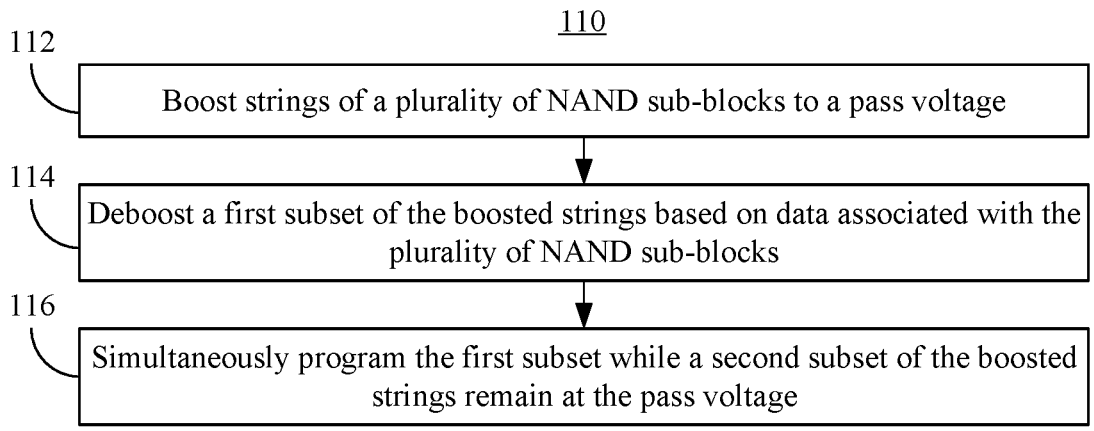
FIG. 11 is a flowchart of an example of a method of operating a memory chip controller according to an embodiment.

FIG. 11 shows a method 110 of operating a memory chip controller. The method 110 may be implemented in one or more modules as a set of logic instructions stored in a machine- or computer-readable storage medium such as random access memory (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality hardware logic using circuit technology such as, for example, application specific integrated circuit (ASIC), complementary metal oxide semiconductor (CMOS) or transistor-transistor logic (TTL) technology, or any combination thereof.

Illustrated processing block 112 boosts strings of a plurality of NAND sub-blocks to a pass voltage. In an embodiment, block 112 includes applying the pass voltage to selected and unselected wordlines that are connected to the plurality of NAND sub-blocks while selected and unselected strings are disconnected from a bitline that receives the data associated with the plurality of NAND sub-blocks. Additionally, block 112 may bypass a boost of an initial NAND sub-block in the plurality of NAND sub-blocks as shown in the programming solution 90 (FIG. 9), already discussed.

Block 114 deboosts a first subset of the boosted strings based on data associated with the plurality of NAND sub-blocks, wherein block 116 simultaneously programs the first subset while a second subset of the boosted strings remain at the pass voltage. In an embodiment, blocks 112, 114 and/or 116 store one or more of sub-block state data, page state data or the data associated with the plurality of NAND sub-blocks to a plurality of latches as discussed with respect to FIGS. 5-8. The illustrated method 110 therefore enhances performance at least to the extent that simultaneously programming multiple NAND sub-blocks reduces programming time.

Figure 12:
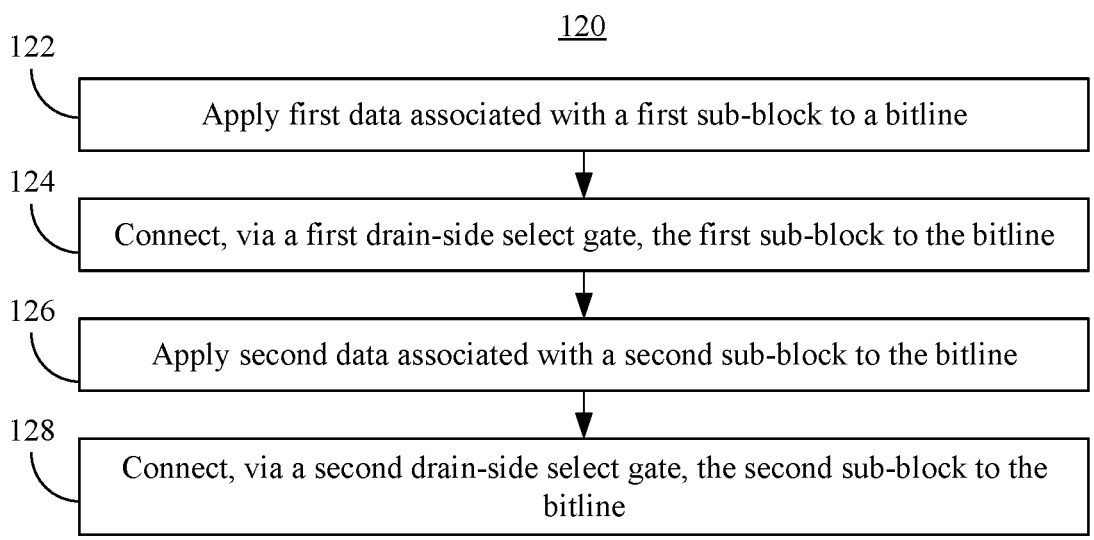
FIG. 12 is a flowchart of an example of a method of deboosting a subset of boosted strings according to an embodiment.

FIG. 12 shows a method 120 of deboosting a subset of boosted strings. The method 120 may generally be incorporated into block 114 (FIG. 11), already discussed. More particularly, the method 120 may be implemented in one or more modules as a set of logic instructions stored in a machine- or computer-readable storage medium such as RAM, ROM, PROM, firmware, flash memory, etc., in configurable logic such as, for example, PLAs, FPGAs, CPLDs, in fixed-functionality hardware logic using circuit technology such as, for example, ASIC, CMOS or TTL technology, or any combination thereof Illustrated processing block 122 applies first data associated with a first sub-block to a bitline. In an embodiment, block 122 includes applying an inhibit voltage level (e.g., $V_{cc}$), a program voltage level (e.g., GND) or an intermediate voltage level (e.g., SSPC) that is between the inhibit voltage level and the program voltage level to the bitline. Block 124 provides for connecting, via a first drain-side select gate, the first sub-block to the bitline. In one example, block 126 applies second data associated with a second sub-block to the bitline. In an embodiment, block 126 includes applying an inhibit voltage level (e.g., $V_{cc}$), a program voltage level (e.g., GND) or an intermediate voltage level (e.g., SSPC) that is between the inhibit voltage level and the program voltage level to individual nodes of the bitline. Block 128 provides for connecting, via a second drain-side select gate, the second sub-block to the bitline.

In one example, blocks 124 and 128 connect the sub-blocks to the bitline momentarily (e.g., via pulses as shown in FIG. 2). In another example, block 124 connects the first sub-block to the bitline momentarily and block 126 connects the second sub-block to the bitline until the first subset is programmed (e.g., as shown in FIG. 10). While the illustrated example programs two sub-blocks to facilitate discussion, more than two sub-blocks may be simultaneously programmed, depending on the circumstances. The illustrated method 120 therefore further enhances performance by sequentially connecting multiple sub-blocks to the bitline.

Figure 13:
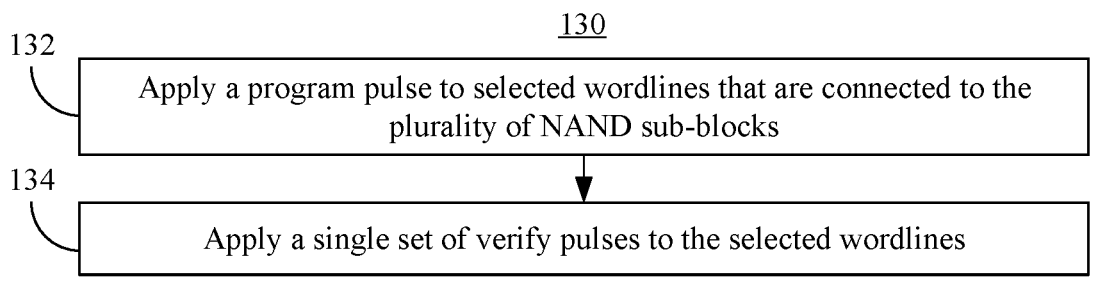
FIG. 13 is a flowchart of an example of a method of simultaneously programming a deboosted subset of strings according to an embodiment.

FIG. 13 shows a method 130 of simultaneously programming a deboosted subset of strings. The method 130 may generally be incorporated into block 116 (FIG. 11), already discussed. More particularly, the method 130 may be implemented in one or more modules as a set of logic instructions stored in a machine- or computer-readable storage medium such as RAM, ROM, PROM, firmware, flash memory, etc., in configurable logic such as, for example, PLAs, FPGAs, CPLDs, in fixed-functionality hardware logic using circuit technology such as, for example, ASIC, CMOS or TTL technology, or any combination thereof.

Illustrated processing block 132 applies a program pulse to selected wordlines that are connected to a plurality of NAND sub-blocks. In an embodiment, block 134 applies a single set of verify pulses to the selected wordlines as in the verify operation sequence 50 (FIG. 4), already discussed. The illustrated method 130 therefore further enhances performance by shortening the verify operation for multiple sub-blocks.

Figure 14:
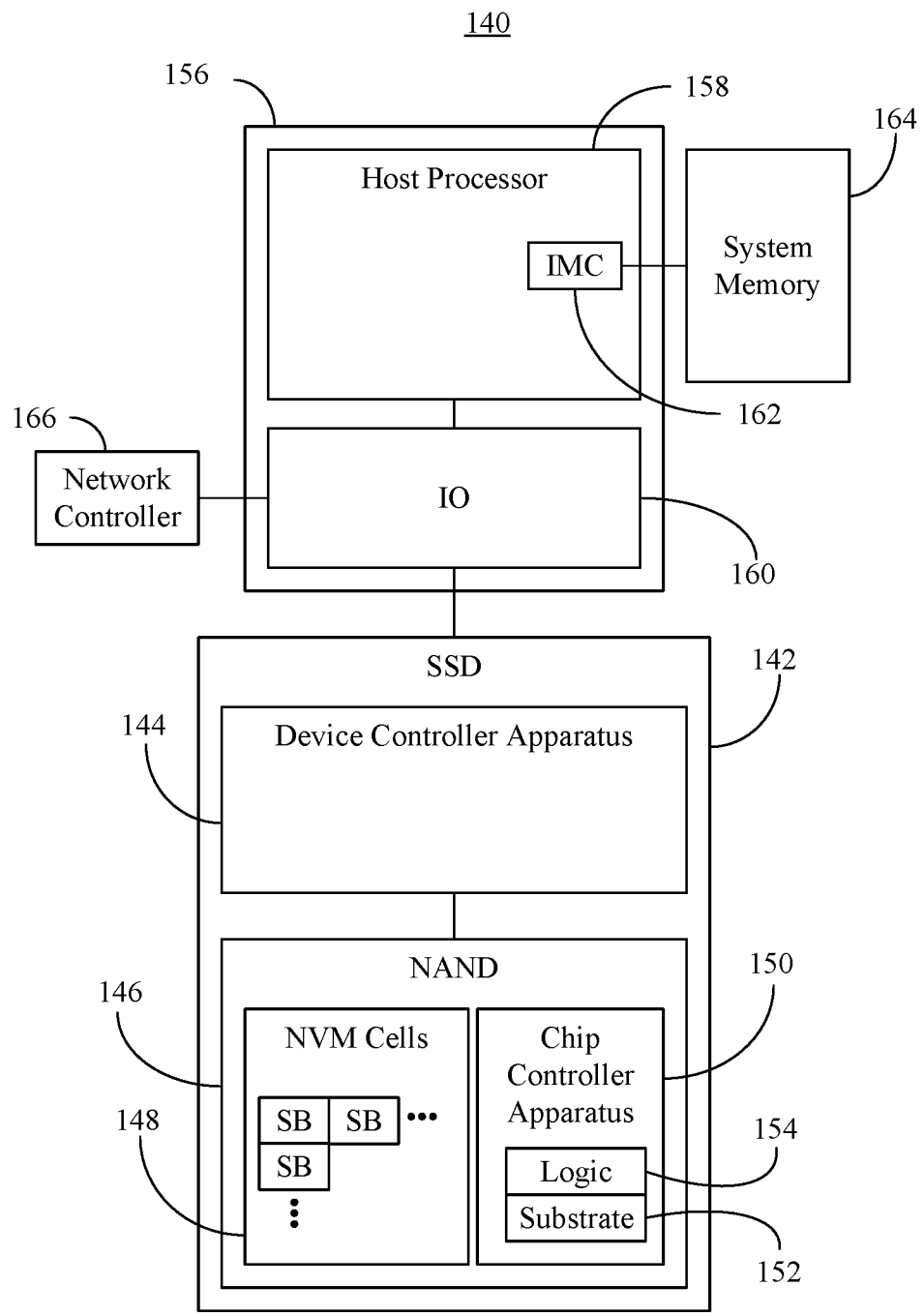
FIG. 14 is a block diagram of an example of a performance-enhanced computing system according to an embodiment.

Turning now to FIG. 14, a performance-enhanced computing system 140 is shown. In the illustrated example, a solid state drive (SSD) 142 includes a device controller apparatus 144 that is coupled to a NAND 146. The illustrated NAND 146 includes a set of NVM cells 148 (e.g., having a plurality of NAND sub-blocks/SBs) and a chip controller apparatus 150 that includes a substrate 152 (e.g., silicon, sapphire, gallium arsenide) and logic 154 (e.g., transistor array and other integrated circuit/IC components) coupled to the substrate 152. The logic 154, which may include one or more of configurable or fixed-functionality hardware, may be configured to perform one or more aspects of the method 110 (FIG. 11), the method 120 (FIG. 12) and/or the method 130 (FIG. 13), already discussed.

More particularly, the logic 154 may boost strings of the plurality of NAND sub-blocks to a pass voltage and deboost a first subset of the boosted strings based on data associated with the plurality of NAND sub-blocks. In an embodiment, the logic 154 also simultaneously programs the first subset while a second subset of the boosted strings remain at the pass voltage.

The illustrated system 140 also includes a system on chip (SoC) 156 having a host processor 158 (e.g., central processing unit/CPU) and an input/output (IO) module 160. The host processor 158 may include an integrated memory controller 162 (IMC) that communicates with system memory 164 (e.g., RAM dual inline memory modules/DIMMs). The illustrated IO module 160 is coupled to the SSD 142 as well as other system components such as a network controller 166.

In one example, the logic 154 includes transistor channel regions that are positioned (e.g., embedded) within the substrate 152. Thus, the interface between the logic 154 and the substrate 152 may not be an abrupt junction. The logic 154 may also be considered to include an epitaxial layer that is grown on an initial wafer of the substrate 152. The illustrated computing system 140 is therefore considered performance-enhanced at least to the extent that simultaneously programming multiple NAND sub-blocks reduces programming time.

ADDITIONAL NOTES AND EXAMPLES

Example 1 includes a memory chip controller comprising one or more substrates and logic coupled to the one or more substrates, wherein the logic is at least partly implemented in one or more of configurable or fixed-functionality hardware, and the logic coupled to the one or more substrates is to boost strings of a plurality of NAND sub-blocks to a pass voltage, deboost a first subset of the boosted strings based on data associated with the plurality of NAND sub-blocks, and simultaneously program the first subset while a second subset of the boosted strings remain at the pass voltage.

Example 2 includes the memory chip controller of Example 1, wherein to boost the strings of the plurality of NAND sub-blocks, the logic is to apply the pass voltage to selected and unselected wordlines that are connected to the plurality of NAND sub-blocks while selected and unselected strings are disconnected from a bitline that receives the data associated with the plurality of NAND sub-blocks.

Example 3 includes the memory chip controller of Example 1, wherein to deboost the first subset of the boosted strings, the logic is to apply first data associated with a first sub-block to a bitline, connect, via a first drain-side select gate, the first sub-block to the bitline, apply second data associated with a second sub-block to the bitline, and connect, via a second drain-side select gate, the second sub-block to the bitline.

Example 4 includes the memory chip controller of Example 3, wherein at least a portion of one or more of the first data or the second data is to be applied at an intermediate voltage level that is between an inhibit voltage level and a program voltage level.

Example 5 includes the memory chip controller of Example 3, wherein the first sub-block and the second sub-block are to be connected to the bitline momentarily.

Example 6 includes the memory chip controller of Example 3, wherein the first sub-block is to be connected to the bitline momentarily and the second sub-block is to be connected to the bitline until the first subset is programmed.

Example 7 includes the memory chip controller of Example 1, wherein to simultaneously program the first subset, the logic is to apply a program pulse to selected wordlines that are connected to the plurality of NAND sub-blocks, and apply a single set of verify pulses to the selected wordlines.

Example 8 includes the memory chip controller of Example 1, wherein the logic is to bypass a boost of an initial NAND sub-block in the plurality of NAND sub-blocks.

Example 9 includes the memory chip controller of any one of Examples 1 to 8, further including a plurality of latches, wherein the logic is to store one or more of sub-block state data, page state data or the data associated with the plurality of NAND sub-blocks to the plurality of latches.

Example 10 includes a computing system comprising a system on chip (SoC), and a solid state drive coupled to the SoC, the solid state drive including a plurality of NAND sub-blocks and a memory chip controller, wherein the memory chip controller includes logic to boost strings of the plurality of NAND sub-blocks to a pass voltage, deboost a first subset of the boosted strings based on data associated with the plurality of NAND sub-blocks, and simultaneously program the first subset while a second subset of the boosted strings remain at the pass voltage.

Example 11 includes the computing system of Example 10, wherein to boost the strings of the plurality of NAND sub-blocks, the logic is to apply the pass voltage to selected and unselected wordlines that are connected to the plurality of NAND sub-blocks while selected and unselected strings are disconnected from a bitline that receives the data associated with the plurality of NAND sub-blocks.

Example 12 includes the computing system of Example 10, wherein to deboost the first subset of the boosted strings, the logic is to apply first data associated with a first sub-block to a bitline, connect, via a first drain-side select gate, the first sub-block to the bitline, apply second data associated with a second sub-block to the bitline, and connect, via a second drain-side select gate, the second sub-block to the bitline.

Example 13 includes the computing system of Example 12, wherein at least a portion of one or more of the first data or the second data is to be applied at an intermediate voltage level that is between an inhibit voltage level and a program voltage level.

Example 14 includes the computing system of Example 12, wherein the first sub-block and the second sub-block are to be connected to the bitline momentarily.

Example 15 includes the computing system of Example 12, wherein the first sub-block is to be connected to the bitline momentarily and the second sub-block is to be connected to the bitline until the first subset is programmed.

Example 16 includes the computing system of Example 10, wherein to simultaneously program the first subset, the logic is to apply a program pulse to selected wordlines that are connected to the plurality of NAND sub-blocks, and apply a single set of verify pulses to the selected wordlines.

Example 17 includes the computing system of Example 10, wherein the logic is to bypass a boost of an initial NAND sub-block in the plurality of NAND sub-blocks.

Example 18 includes the computing system of any one of Examples 10 to 17, wherein the memory chip controller further includes a plurality of latches, and wherein the logic is to store one or more of sub-block state data, page state data or the data associated with the plurality of NAND sub-blocks to a plurality of latches.

Example 19 includes a method comprising boosting strings of a plurality of NAND sub-blocks to a pass voltage, deboosting a first subset of the boosted strings based on data associated with the plurality of NAND sub-blocks, and simultaneously programming the first subset while a second subset of the boosted strings remain at the pass volage.

Example 20 includes the method of Example 19, wherein boosting the strings of the plurality of NAND sub-blocks includes applying the pass voltage to selected and unselected wordlines that are connected to the plurality of NAND sub-blocks while selected and unselected strings are disconnected from a bitline that receives the data associated with the plurality of NAND sub-blocks.

Technology described herein therefore boosts all sub-blocks (e.g., WLs are ramped while pillars are disconnected from the BLs), then deboosts multiple SBs based on their corresponding data by turning on and off the corresponding SGDs one at a time. Once the pillars are disconnected from the BLs, a single program pulse is applied to the selected WL to program multiple SBs simultaneously.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/ or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:
1. A memory chip controller comprising:
one or more substrates; and
logic coupled to the one or more substrates, wherein the logic is at least partly implemented in one or more of configurable or fixed-functionality hardware, and the logic coupled to the one or more substrates is to:

boost strings of a plurality of NAND sub-blocks to a pass voltage, and bypass a boost of an initial NAND sub-block in the plurality of NAND sub-blocks;
deboost a first subset of the boosted strings based on data associated with the plurality of NAND sub-blocks; and
simultaneously program the first subset while a second subset of the boosted strings remain at the pass voltage.

2. The memory chip controller of claim 1, wherein to boost the strings of the plurality of NAND sub-blocks, the logic is to apply the pass voltage to selected and unselected wordlines that are connected to the plurality of NAND sub-blocks while selected and unselected strings are disconnected from a bitline that receives the data associated with the plurality of NAND sub-blocks.

3. The memory chip controller of claim 1, wherein to deboost the first subset of the boosted strings, the logic is to:
apply first data associated with a first sub-block to a bitline;
connect, via a first drain-side select gate, the first sub-block to the bitline;
apply second data associated with a second sub-block to the bitline; and
connect, via a second drain-side select gate, the second sub-block to the bitline.

4. The memory chip controller of claim 3, wherein at least a portion of one or more of the first data or the second data is to be applied at an intermediate voltage level that is between an inhibit voltage level and a program voltage level.

5. The memory chip controller of claim 3, wherein the first sub-block and the second sub-block are to be connected to the bitline momentarily.

6. The memory chip controller of claim 3, wherein the first sub-block is to be connected to the bitline momentarily and the second sub-block is to be connected to the bitline until the first subset is programmed.

7. The memory chip controller of claim 1, wherein to simultaneously program the first subset, the logic is to:
apply a program pulse to selected wordlines that are connected to the plurality of NAND sub-blocks; and
apply a single set of verify pulses to the selected wordlines.

8. The memory chip controller of claim 1, further including a plurality of latches, wherein the logic is to store one or more of sub-block state data, page state data or the data associated with the plurality of NAND sub-blocks to the plurality of latches.

9. A computing system comprising:
a system on chip (SoC); and
a solid state drive coupled to the SoC, the solid state drive including a plurality of NAND sub-blocks and a memory chip controller, wherein the memory chip controller includes logic to:
boost strings of the plurality of NAND sub-blocks to a pass voltage, and bypass a boost of an initial NAND sub-block in the plurality of NAND sub-blocks,
deboost a first subset of the boosted strings based on data associated with the plurality of NAND sub-blocks, and
simultaneously program the first subset while a second subset of the boosted strings remain at the pass voltage.

10. The computing system of claim 9, wherein to boost the strings of the plurality of NAND sub-blocks, the logic is to apply the pass voltage to selected and unselected wordlines that are connected to the plurality of NAND sub-blocks while selected and unselected strings are disconnected from a bitline that receives the data associated with the plurality of NAND sub-blocks.

11. The computing system of claim 9, wherein to deboost the first subset of the boosted strings, the logic is to:
apply first data associated with a first sub-block to a bitline,
connect, via a first drain-side select gate, the first sub-block to the bitline,
apply second data associated with a second sub-block to the bitline, and
connect, via a second drain-side select gate, the second sub-block to the bitline.

12. The computing system of claim 11, wherein at least a portion of one or more of the first data or the second data is to be applied at an intermediate voltage level that is between an inhibit voltage level and a program voltage level.

13. The computing system of claim 11, wherein the first sub-block and the second sub-block are to be connected to the bitline momentarily.

14. The computing system of claim 11, wherein the first sub-block is to be connected to the bitline momentarily and the second sub-block is to be connected to the bitline until the first subset is programmed.

15. The computing system of claim 9, wherein to simultaneously program the first subset, the logic is to:
apply a program pulse to selected wordlines that are connected to the plurality of NAND sub-blocks, and
apply a single set of verify pulses to the selected wordlines.

16. The computing system of claim 9, wherein the memory chip controller further includes a plurality of latches, and wherein the logic is to store one or more of sub-block state data, page state data or the data associated with the plurality of NAND sub-blocks to a plurality of latches.

17. A method comprising:
boosting strings of a plurality of NAND sub-blocks to a pass voltage, and bypass a boost of an initial NAND sub-block in the plurality of NAND sub-blocks;
deboosting a first subset of the boosted strings based on data associated with the plurality of NAND sub-blocks; and
simultaneously programming the first subset while a second subset of the boosted strings remain at the pass volage.

18. The method of claim 17, wherein boosting the strings of the plurality of NAND sub-blocks includes applying the pass voltage to selected and unselected wordlines that are connected to the plurality of NAND sub-blocks while selected and unselected strings are disconnected from a bitline that receives the data associated with the plurality of NAND sub-blocks.

* * * * *